(12) United States Patent
Horii

(10) Patent No.: US 9,966,437 B2
(45) Date of Patent: May 8, 2018

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventor: Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days. days.

(21) Appl. No.: 14/896,973

(22) PCT Filed: May 9, 2014

(86) PCT No.: PCT/JP2014/062438
§ 371 (c)(1),
(2) Date: Dec. 9, 2015

(87) PCT Pub. No.: WO2014/199753
PCT Pub. Date: Dec. 18, 2014

(65) Prior Publication Data
US 2016/0133705 A1 May 12, 2016

(30) Foreign Application Priority Data
Jun. 12, 2013 (JP) ................................ 2013-123871

(51) Int. Cl.
*H01L 21/302* (2006.01)
*H01L 21/461* (2006.01)
(Continued)

(52) U.S. Cl.
CPC .... *H01L 29/1608* (2013.01); *H01L 21/02164* (2013.01); *H01L 21/02378* (2013.01);
(Continued)

(58) Field of Classification Search
None
See application file for complete search history.

(56) References Cited

U.S. PATENT DOCUMENTS 5,751,055 A 5/1998 Maruyama et al.
5,989,985 A 11/1999 Maruyama et al.
(Continued)

FOREIGN PATENT DOCUMENTS

JP H07-226349 A 8/1995
JP 2003-142357 A 5/2003
(Continued)

OTHER PUBLICATIONS

International Search Report and Written Opinion in PCT International Application No. PCT/JP2014/062438, dated Aug. 5, 2014.
(Continued)

*Primary Examiner* — Stephanie P Duclair
(74) *Attorney, Agent, or Firm* — Venable LLP; Michael A. Sartori; Laura G. Remus

(57) ABSTRACT

Included are the steps of: preparing a silicon carbide substrate having an epitaxial layer formed thereon; forming an upper-layer film on the epitaxial layer; and removing at least a portion of the upper-layer film in an outer peripheral portion of the silicon carbide substrate, and patterning the upper-layer film.

7 Claims, 10 Drawing Sheets

(51) Int. Cl.

| | |
|---|---|
| *B44C 1/22* | (2006.01) |
| *C23F 1/00* | (2006.01) |
| *C03C 15/00* | (2006.01) |
| *C03C 25/68* | (2006.01) |
| *C25F 3/00* | (2006.01) |
| *H01L 29/16* | (2006.01) |
| *H01L 29/66* | (2006.01) |
| *H01L 29/78* | (2006.01) |
| *H01L 29/06* | (2006.01) |
| *H01L 21/3065* | (2006.01) |
| *H01L 21/308* | (2006.01) |
| *H01L 21/02* | (2006.01) |
| *H01L 21/04* | (2006.01) |
| *H01L 21/311* | (2006.01) |
| *H01L 29/423* | (2006.01) |
| *H01L 29/04* | (2006.01) |

(52) U.S. Cl.
CPC ...... H01L 21/0445 (2013.01); H01L 21/3065 (2013.01); H01L 21/3081 (2013.01); H01L 21/3083 (2013.01); H01L 21/31111 (2013.01); H01L 21/31144 (2013.01); H01L 29/0657 (2013.01); H01L 29/66068 (2013.01); H01L 29/7813 (2013.01); H01L 29/045 (2013.01); H01L 29/4236 (2013.01)

(56) References Cited

U.S. PATENT DOCUMENTS

| | | | |
|---|---|---|---|
| 7,638,439 | B2 | 12/2009 | Kubota et al. |
| 2003/0038383 | A1* | 2/2003 | Sakaguchi ............ H01L 23/544 257/797 |
| 2007/0264822 | A1 | 11/2007 | Kubota et al. |
| 2009/0256162 | A1* | 10/2009 | Jenny ...................... C30B 33/00 257/77 |
| 2011/0089522 | A1 | 4/2011 | Narazaki |
| 2011/0207294 | A1* | 8/2011 | Nakanishi ............... B24B 9/065 438/459 |
| 2012/0244680 | A1 | 9/2012 | Hatsukawa |
| 2013/0032822 | A1* | 2/2013 | Ishibashi ........... H01L 21/02002 257/77 |

FOREIGN PATENT DOCUMENTS

| | | | |
|---|---|---|---|
| JP | 2007-150185 | A | 6/2007 |
| JP | 2010-064918 | A | 3/2010 |
| JP | 2010-212440 | A | 9/2010 |
| JP | 2010212440 | * | 9/2010 |
| JP | 2011-086771 | A | 4/2011 |
| JP | 2012-142485 | A | 7/2012 |
| JP | 2012-204568 | A | 10/2012 |
| JP | 2013-055192 | A | 3/2013 |
| WO | 2006/124174 | A2 | 11/2006 |

OTHER PUBLICATIONS

Notification in counterpart Japanese Patent Application No. 2013-123871, dated Nov. 15, 2016.
Extended European Search Report in counterpart European Patent Application No. 14811664.3, dated Dec. 19, 2016.
Savage et al., "Sensitive and stable SiC APD for UV Detection," Optical Sensing and Detection, Proc. of SPIE vol. 7726, 772622, Apr. 15, 2010, pp. 1-8.
Notice of Grounds of Rejection in Japanese Patent Application No. 2013-123871, dated Aug. 2, 2016.

* cited by examiner

METHOD FOR MANUFACTURING SILICON CARBIDE SEMICONDUCTOR DEVICE

TECHNICAL FIELD

The present invention relates to a method for manufacturing a silicon carbide semiconductor device, and in particular to a method for manufacturing a silicon carbide semiconductor device which performs ion implantation on a silicon carbide substrate having an epitaxial layer.

BACKGROUND ART

Silicon carbide (SiC) is a wide band gap semiconductor having a band gap larger than that of silicon (Si), which has been conventionally widely used as a material for semiconductor devices, and has a large breakdown field strength. Further, silicon carbide has an electron saturation speed and a heat conductivity higher than those of silicon, and thus silicon carbide has excellent characteristics as a semiconductor material for power semiconductor devices.

Regarding a silicon carbide substrate used as a material in a method for manufacturing a silicon carbide semiconductor device, for example, single crystal silicon carbide obtained by a sublimation method is cut into wafers, then an epitaxial layer is formed on the single crystal silicon carbide in which a side surface portion has been chamfered, and further, a process such as ion implantation is performed on the epitaxial layer. The ion implantation on the epitaxial layer is performed, for example, by forming a mask made of silicon dioxide ($SiO_2$) on the epitaxial layer, and implanting ions through the mask.

Japanese Patent Laying-Open No. 2010-64918 (PTD 1) describes forming a silicon carbide epitaxial layer on a silicon carbide single crystal wafer in which a side surface portion of a silicon carbide substrate has been chamfered.

CITATION LIST

Patent Document

PTD 1: Japanese Patent Laying-Open No. 2010-64918

SUMMARY OF INVENTION

Technical Problem

However, when a silicon carbide semiconductor device is manufactured using a silicon carbide substrate having an epitaxial layer formed on a silicon carbide single crystal which has been chamfered, there have been cases where an upper-layer film such as a mask formed on the epitaxial layer of the silicon carbide substrate becomes cracked. For example, when a crack occurs in a silicon dioxide layer as an upper-layer film covering a region where ion implantation should be prevented, unintended ion implantation is performed on the region where ion implantation should be prevented. In this case, this leads to poor electrical characteristics of the silicon carbide semiconductor device.

The present invention has been made to solve the aforementioned problem. The main object of the present invention is to provide a method for manufacturing a silicon carbide semiconductor device capable of reducing a risk that a crack occurs in an upper-layer film formed on a silicon carbide substrate.

Solution to Problem

A method for manufacturing a silicon carbide semiconductor device in accordance with the present invention includes the steps of: preparing a silicon carbide substrate having an epitaxial layer formed thereon; forming an upper-layer film on the epitaxial layer; and removing at least a portion of the upper-layer film in an outer peripheral portion of the silicon carbide substrate, and patterning the upper-layer film.

Advantageous Effects of Invention

According to the present invention, a method for manufacturing a silicon carbide semiconductor device capable of reducing a risk that a crack occurs in an upper-layer film formed on a silicon carbide substrate can be provided.

DESCRIPTION OF EMBODIMENTS

Figure 1:
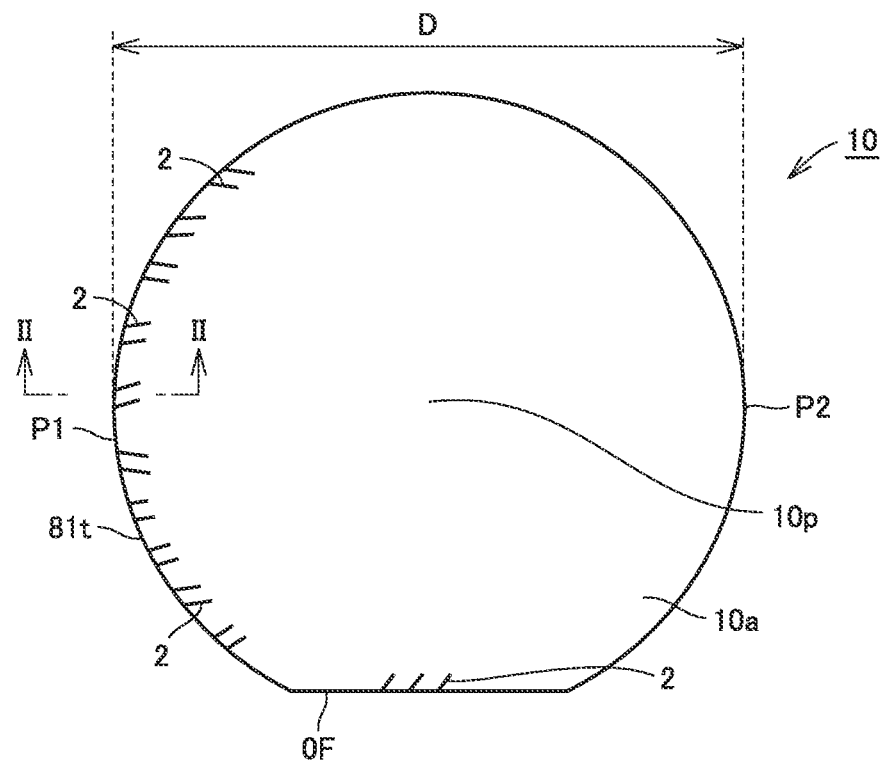
FIG. 1 is a plan view for illustrating a silicon carbide substrate in accordance with an embodiment of the present invention.

Hereinafter, an embodiment of the present invention will be described with reference to the drawings. It should be noted that identical or corresponding parts will be designated by the same reference numerals, and the description thereof will not be repeated. Further, regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "−" (bar) above a numeral, but is expressed by putting the negative sign before the numeral in the present specification.

First, a summary of the embodiment of the present invention will be listed.

(1) A method for manufacturing a silicon carbide semiconductor device in accordance with the embodiment includes the step of: preparing a silicon carbide substrate 10 having an epitaxial layer 81 formed thereon (S10); forming an upper-layer film (a silicon dioxide layer 63, an interlayer insulating film 93) on epitaxial layer 81 (S20, S90); and removing at least a portion of the upper-layer film (silicon dioxide layer 63, interlayer insulating film 93) in an outer peripheral portion of silicon carbide substrate 10, and patterning the upper-layer film (silicon dioxide layer 63, interlayer insulating film 93) (S30, S100).

According to the method for manufacturing the silicon carbide semiconductor device in accordance with the present embodiment as described above, in the step of patterning (S30, S100), the upper-layer film is patterned (step (S32), step (S102)) after or simultaneously with removing the at least a portion of the upper-layer film (silicon dioxide layer 63, interlayer insulating film 93) in the outer peripheral portion of silicon carbide substrate 10 (step (S31), step (S101)). Here, "removing at least a portion" has two meanings: it means partially removing the upper-layer film within a fourth main surface 10a of silicon carbide substrate 10, and it also means reducing the film thickness of the upper-layer film in a thickness direction of silicon carbide substrate 10. For example, when an abnormality such as a stepped portion 2 partially occurs on epitaxial layer 81 in the outer peripheral portion of silicon carbide substrate 10, the upper-layer film formed at least on stepped portion 2 in the outer peripheral portion may be removed. Further, on this occasion, the film thickness of the upper-layer film formed on stepped portion 2 may be reduced, and a portion of the upper-layer film may remain on stepped portion 2.

In a case where the upper-layer film (silicon dioxide layer 63, interlayer insulating film 93) formed on stepped portion 2 is completely removed, even when a stress is applied to the upper-layer film formed on a center 10p side of silicon carbide substrate 10, occurrence of a crack resulting from stepped portion 2 can be suppressed. Further, even when the film thickness of the upper-layer film formed on stepped portion 2 is reduced and a portion of the upper-layer film remains on stepped portion 2, a stress applied to the upper-layer film formed on stepped portion 2 of silicon carbide substrate 10 can be reduced, when compared with a conventional method for manufacturing a silicon carbide semiconductor device in which an upper-layer film is patterned with being thickly formed in an outer peripheral portion of a silicon carbide substrate. Accordingly, this can suppress a crack starting from stepped portion 2 from occurring in the upper-layer film.

(2) In the method for manufacturing the silicon carbide semiconductor device in accordance with the embodiment, in the step of patterning (S30, S100), the upper-layer film (silicon dioxide layer 63, interlayer insulating film 93) may be patterned (step (S32), step (S102)) after removing the at least a portion of the upper-layer film (silicon dioxide layer 63, interlayer insulating film 93) in the outer peripheral portion of silicon carbide substrate 10 (step (S31), step (S101)). With this configuration, even when a stress is applied to the upper-layer film during the step of patterning (S32, S102), the upper-layer film is not in direct contact with stepped portion 2, or, even if the upper-layer film is in contact with stepped portion 2, the film thickness of the upper-layer film in contact with stepped portion 2 is smaller than the film thickness of the upper-layer film formed on the center 10p side of silicon carbide substrate 10. Accordingly, this can reduce a risk that a crack starting from stepped portion 2 occurs in the upper-layer film.

(3) In the method for manufacturing the silicon carbide semiconductor device in accordance with the embodiment, in the step of patterning (S30, S100), patterning of the upper-layer film (silicon dioxide layer 63, interlayer insulating film 93) and removal of the at least a portion of the upper-layer film in the outer peripheral portion of silicon carbide substrate 10 may be performed as one step. That is, the at least a portion of the upper-layer film may be removed in the outer peripheral portion of silicon carbide substrate 10, simultaneously with patterning the upper-layer film. Also with this configuration, a stress applied to the upper-layer film formed in the outer peripheral portion of silicon carbide substrate 10 can be reduced, when compared with a conventional method for manufacturing a silicon carbide semiconductor device in which an upper-layer film is patterned with being thickly formed in an outer peripheral portion of silicon carbide substrate 10. Accordingly, even when an abnormality such as a stepped portion occurs on epitaxial layer 81 in the outer peripheral portion of silicon carbide substrate 10 for example, a risk that a crack starting from stepped portion 2 occurs in the upper-layer film can be reduced.

(4) In the method for manufacturing the silicon carbide semiconductor device in accordance with the embodiment, in the step of patterning (S30, S100), the upper-layer film (silicon dioxide layer 63, interlayer insulating film 93) on a region where a stepped portion is formed in epitaxial layer 81 in the outer peripheral portion of silicon carbide substrate 10 may be removed. With this configuration, even when a stress is applied to the upper-layer film formed on silicon carbide substrate 10 when the upper-layer film is patterned (S32, S102), the upper-layer film is not in direct contact with stepped portion 2, and thus a risk that a crack starting from stepped portion 2 occurs in the upper-layer film can be reduced.

(5) In the method for manufacturing the silicon carbide semiconductor device in accordance with the embodiment, in the step of patterning (S30, S100), the upper-layer film (silicon dioxide layer 63, interlayer insulating film 93) may be removed along an entire periphery of the outer peripheral portion of silicon carbide substrate 10. With this configuration, even when an abnormality such as stepped portion 2 occurs on epitaxial layer 81 in the outer peripheral portion of silicon carbide substrate 10 for example, contact between stepped portion 2 and the upper-layer film formed on the center 10*p* side of silicon carbide substrate 10 (on an element formation region) can be prevented. Further, a stress applied to the upper-layer film formed on the center 10*p* side of silicon carbide substrate 10 can be reduced, when compared with a conventional method for manufacturing a silicon carbide semiconductor device in which an upper-layer film is patterned with being thickly formed in an outer peripheral portion of silicon carbide substrate 10. Accordingly, a risk that a crack occurs in the upper-layer film can be reduced.

(6) In the method for manufacturing the silicon carbide semiconductor device in accordance with the embodiment, in the step of patterning (S30, S100), the upper-layer film (silicon dioxide layer 63, interlayer insulating film 93) may be removed, by a width of more than or equal to 0.3 mm and less than or equal to 3 mm, from an outer peripheral end portion toward the center of silicon carbide substrate 10. With this configuration, even when an abnormality such as a stepped portion occurs on epitaxial layer 81 in the outer peripheral portion of silicon carbide substrate 10 for example, contact between stepped portion 2 and the upper-layer film formed on the center 10*p* side of silicon carbide substrate 10 (on the element formation region) can be prevented. As a result, a risk that a crack occurs in the upper-layer film can be reduced. Further, since the pattern of the upper-layer film can be formed in a sufficiently large region in the silicon carbide substrate, a sufficiently large region where the silicon carbide semiconductor device can be formed (element formation region) can be obtained.

(7) In the method for manufacturing the silicon carbide semiconductor device in accordance with the embodiment, the upper-layer film (silicon dioxide layer 63, interlayer insulating film 93) may be made of silicon dioxide. In this case, even when an impurity region is ion-implanted into epitaxial layer 81 using the upper-layer film made of silicon dioxide as a mask for example, unintended ion implantation from a location where a crack occurs in the upper-layer film can be prevented. As a result, reduction in the yield of silicon carbide semiconductor devices 100 can be suppressed.

(8) In the method for manufacturing the silicon carbide semiconductor device in accordance with the embodiment, silicon carbide substrate 10 may have an outer diameter of more than or equal to 100 mm. Thus, even when silicon carbide substrate 10 has an outer diameter of more than or equal to 100 mm, the method for manufacturing the silicon carbide semiconductor device in accordance with the embodiment of the present invention can reduce a risk that a crack occurs in the upper-layer film formed on silicon carbide substrate 10.

As a result of earnest studies on the reason why a crack occurs in a silicon dioxide layer as an upper-layer film formed on a silicon carbide substrate, the inventors have obtained the following findings and arrived at the present invention. First, the problem that a crack occurs in the silicon dioxide layer is dependent on the size (outer diameter) of the silicon carbide substrate and the film thickness of the upper-layer film (silicon dioxide layer). Although a crack rarely occurs in the silicon dioxide layer when the size of the silicon carbide substrate is less than 100 mm, it occurs in particular when the size of the silicon carbide substrate is more than or equal to 100 mm, and it significantly occurs in particular when the size of the silicon carbide substrate is more than or equal to 150 mm. Further, when the size of the silicon carbide substrate is more than or equal to 100 mm, a crack occurs when the film thickness of the silicon dioxide layer is thick, such as more than or equal to 0.5 µm.

On the other hand, a crack does not occur in the silicon dioxide layer immediately after the silicon dioxide layer is formed on an epitaxial layer. As a result of investigation, it has been found that a crack occurs in the silicon dioxide layer after the silicon dioxide layer is patterned and processed as a mask in order to perform ion implantation using the silicon dioxide layer as the mask. On this occasion, a crack in the silicon dioxide layer extends from an outer peripheral portion.

Here, in a silicon carbide epitaxial layer formed on a silicon carbide single crystal substrate, a stepped portion is formed in an outer peripheral end portion of the silicon carbide epitaxial layer. The height of the stepped portion (height from an upper surface in the central portion of the silicon carbide epitaxial layer to the highest point of the stepped portion) is more than or equal to 1 µm and less than or equal to 50 µm. That is, the silicon dioxide layer formed on the epitaxial layer in the outer peripheral portion is formed on the stepped portion described above. Further, in the silicon dioxide layer, a stress resulting from the difference in thermal expansion coefficient between silicon dioxide and silicon carbide is generated. Therefore, it is presumed that, by performing the step of patterning the silicon dioxide layer or the like, the stress within the silicon dioxide layer becomes apparent, or a large stress is generated, causing a crack in the silicon dioxide layer. Furthermore, since it is thought that the effect of the above stress becomes significant in proportion to the size of the silicon carbide substrate and the thickness of the upper-layer film, it is thought that, when the size of the silicon carbide substrate is more than or equal to 100 mm and the film thickness of the silicon dioxide layer is thick such as more than or equal to 0.5 µm, a crack starting from the stepped portion is likely to occur due to the above stress.

Based on the above findings, it is thought that removing the silicon dioxide layer formed on the stepped portion formed in the epitaxial layer in the outer peripheral portion of the silicon carbide substrate as described above, before or simultaneously with performing patterning with the silicon dioxide layer being formed, can reduce a risk that a crack occurs in the silicon dioxide layer to extend, starting from the stepped portion, in a direction in which the stepped portion extends.

In addition, the material constituting the upper-layer film is not limited to silicon dioxide, and it is thought that the same effect can be exhibited as long as the material has a thermal expansion coefficient different from that of silicon carbide.

Next, details of the present embodiment will be described.

First, a configuration of silicon carbide substrate 10 used for a method for manufacturing a silicon carbide semiconductor device in accordance with a first embodiment will be described with reference to FIGS. 1 and 2. Silicon carbide substrate 10 in accordance with the first embodiment mainly has a silicon carbide single crystal substrate 80 and a silicon carbide epitaxial layer 81. Silicon carbide single crystal substrate 80 is made of, for example, hexagonal silicon carbide having a polytype of 4H. Silicon carbide single crystal substrate 80 contains an impurity element such as nitrogen, for example, and the conductivity type of silicon carbide single crystal substrate 80 is n type (a first conductivity type). The impurity such as nitrogen contained in silicon carbide single crystal substrate 80 has a concentration of, for example, more than or equal to about $1\times10^{18}$ $cm^{-3}$ and less than or equal to about $1\times10^{19} cm^{-3}$. Silicon carbide single crystal substrate 80 has a first main surface 80a, a second main surface 80b opposite to first main surface 80a, and a first side end portion 80e connecting first main surface 80a and second main surface 80b. First side end portion 80e is a chamfered surface, and is a portion having a curvature projecting in an outer peripheral direction when viewed in a cross sectional view (field of view in the direction parallel to the first main surface). First main surface 80a may be, for example, a {0001} plane, or a plane having an off angle of less than or equal to about 10° relative to the {0001} plane, or a plane having an off angle of less than or equal to about 0.25° relative to the {0001} plane. In other words, first main surface 80a may be, for example, a (0001) plane or a (000-1) plane, or a plane having an off angle of less than or equal to about 10° relative to the (0001) plane or the (000-1) plane, or a plane having an off angle of less than or equal to about 0.25° relative to the (0001) plane or the (000-1) plane.

Silicon carbide epitaxial layer 81 is provided on and in contact with first main surface 80a of silicon carbide single crystal substrate 80. Silicon carbide epitaxial layer 81 has a thickness of, for example, more than or equal to about 5 μm and less than or equal to about 40 μm. Silicon carbide epitaxial layer 81 contains an impurity element such as nitrogen, for example, and the conductivity type of silicon carbide epitaxial layer 81 is n type. The impurity concentration of silicon carbide epitaxial layer 81 may be lower than the impurity concentration of silicon carbide single crystal substrate 80. The impurity concentration of silicon carbide epitaxial layer 81 is, for example, more than or equal to about $1\times10^{15}$ $cm^{-3}$ and less than or equal to about $1\times10^{16}$ $cm^{-3}$. Silicon carbide epitaxial layer 81 has a third main surface 10b in contact with first main surface 80a, and fourth main surface 10a opposite to third main surface 10b.

Referring to FIG. 1, when viewed in a plan view (field of view in the direction of the normal to fourth main surface 10a), the maximum value of a width D of silicon carbide substrate 10 is more than or equal to 100 mm. Preferably, the maximum value of width D of silicon carbide substrate 10 is more than or equal to 150 mm. Silicon carbide substrate 10 is substantially circular. Silicon carbide substrate 10 may have an orientation flat portion OF provided, for example, in a {10-10} plane in a <11-20> direction.

Figure 2:
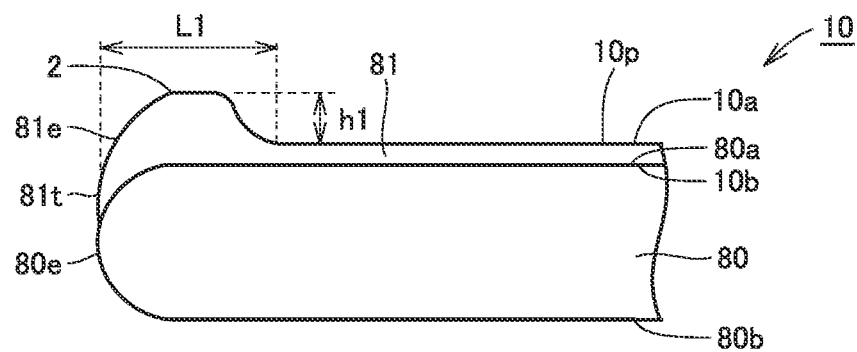
FIG. 2 is a cross sectional view seen from a line-segment II-II in FIG. 1.

Referring to FIG. 2, a plurality of stepped portions 2 are formed in an outer peripheral portion of silicon carbide epitaxial layer 81. Stepped portions 2 are each formed to extend from an outer peripheral end portion 81t toward center 10p of silicon carbide substrate 10. Stepped portion 2 has a length (L1: see FIG. 2) of, for example, more than or equal to about 50 μm and less than or equal to about 3000 μm, or about 300 μm in a typical example, on fourth main surface 10a, in a direction along a radial direction of silicon carbide single crystal substrate 80. It should be noted that the direction in which stepped portion 2 extends on fourth main surface 10a (direction from outer peripheral end portion 81t toward center 10p) is substantially equal to the radial direction of silicon carbide single crystal substrate 80 (direction from outer peripheral end portion 81t toward center 10p). Referring to FIG. 1, typically, stepped portions 2 are mainly formed on the orientation flat portion OF side, which is a lower side in the drawing of fourth main surface 10a, and on a first portion P1 side, which is a left side in the drawing of fourth main surface 10a, and are rarely formed on a second portion P2 side opposite to the first portion P1 side. Stepped portion 2 has a height (h1: see FIG. 2) of, for example, more than or equal to about 1 μm and less than or equal to about 50 μm, with respect to fourth main surface 10a, in a thickness direction of silicon carbide substrate 10 (direction perpendicular to fourth main surface 10a). It should be noted that, when observed in a scanning electron microscope (SEM) image, stepped portions 2 are observed as irregularities.

Figure 3:
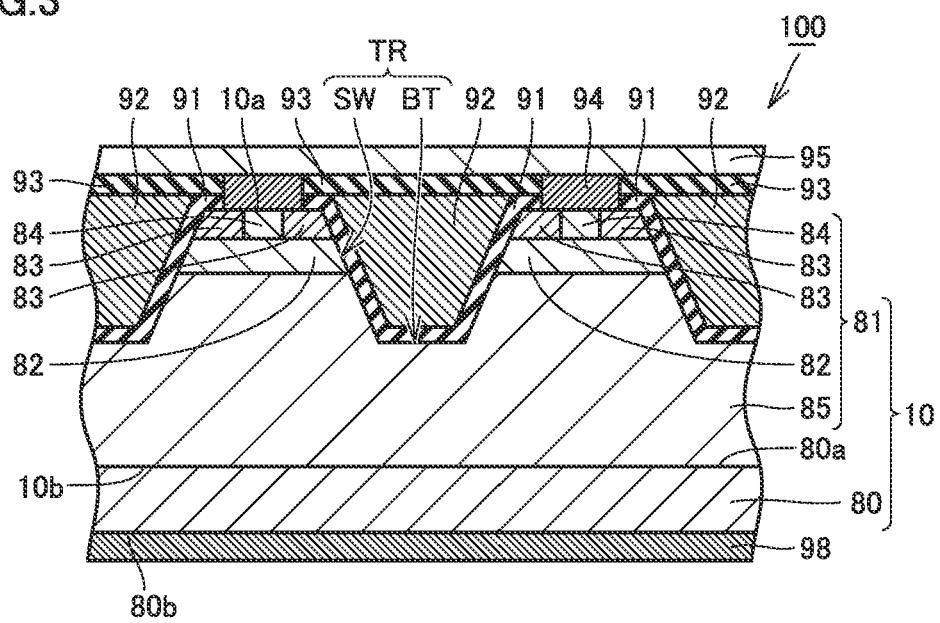
FIG. 3 is a cross sectional view for illustrating a silicon carbide semiconductor device in accordance with the embodiment of the present invention.

Next, silicon carbide semiconductor device 100 in accordance with the first embodiment will be described with reference to FIG. 3. In the present embodiment, silicon carbide semiconductor device 100 is a MOSFET. Silicon carbide semiconductor device 100 mainly includes silicon carbide substrate 10 in accordance with the present embodiment described above, a gate insulating film 91, a gate electrode 92, a source electrode 94, and a drain electrode 98. Silicon carbide substrate 10 includes silicon carbide single crystal substrate 80 and silicon carbide epitaxial layer 81 as described above, and silicon carbide epitaxial layer 81 mainly has a p type body region 82, an n type source region 83, and a p type contact region 84. Epitaxial layer 81 (an n type drift region 85) is an epitaxial layer having n type conductivity type, and is formed on main surface 80a of silicon carbide single crystal substrate 80. P type body region 82 has p type conductivity type, and is provided on n type drift region 85. N type source region 83 has n type conductivity type, and is provided on p type body region 82 to be separated from n type drift region 85 by p type body region 82. P type contact region 84 has p type conductivity type, and is connected to p type body region 82 and source electrode 94.

Gate insulating film 91 covers each of a wall surface SW and a bottom portion BT of a trench TR. Gate electrode 92 is provided on gate insulating film 91. Source electrode 94 is in contact with each of n type source region 83 and p type contact region 84. A source wire 95 is in contact with source electrode 94. Source wire 95 is an aluminum layer, for example. Interlayer insulating film 93 insulates gate electrode 92 from source wire 95. Drain electrode 98 (back surface electrode) is arranged in contact with silicon carbide single crystal substrate 80.

Figure 4:
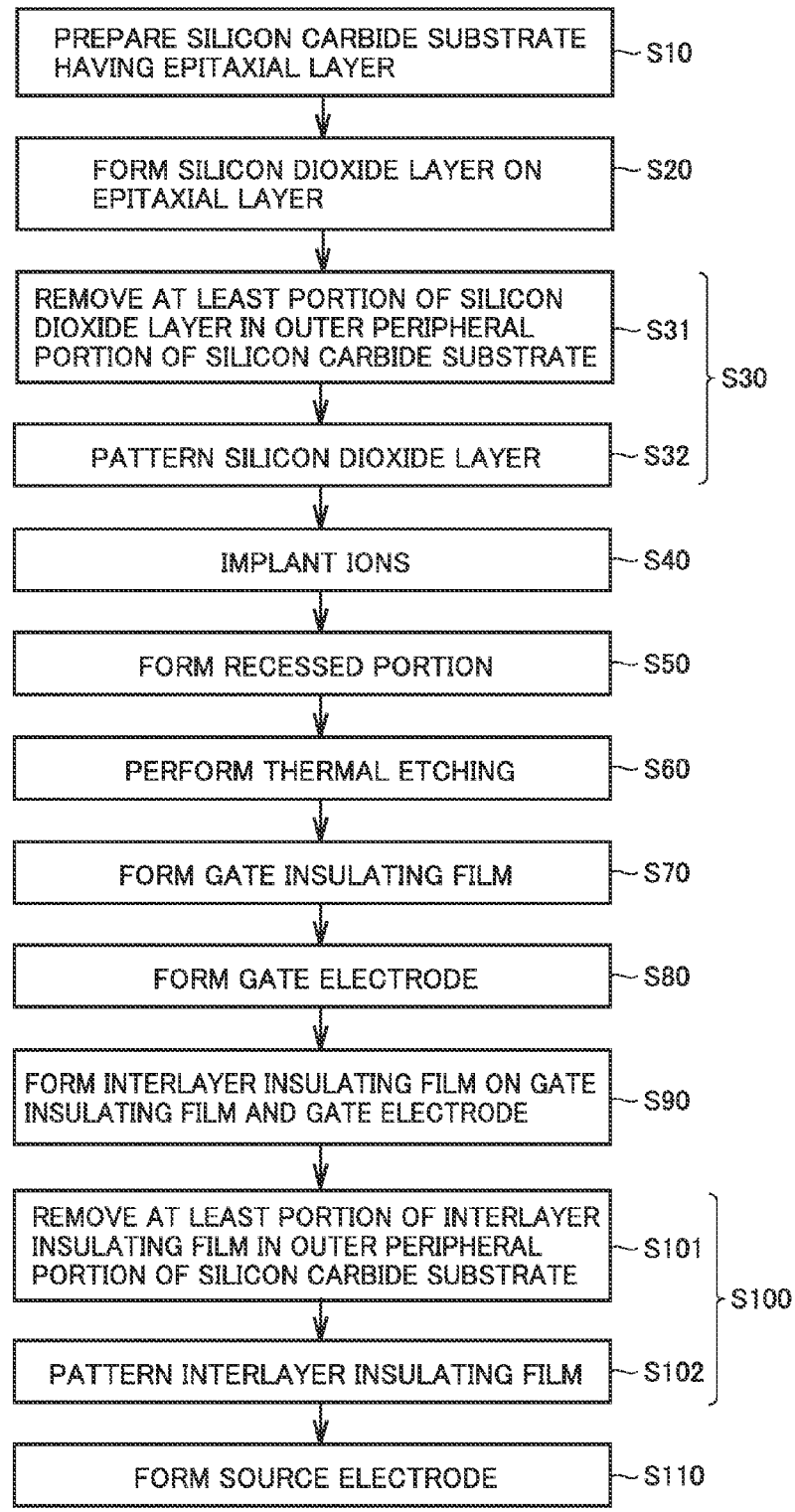
FIG. 4 is a flowchart of a method for manufacturing the silicon carbide semiconductor device in accordance with the embodiment of the present invention.

Next, a method for manufacturing the silicon carbide semiconductor device in accordance with the first embodiment will be described with reference to FIG. 4. First, the step of preparing a silicon carbide substrate having an epitaxial layer (S10) is performed. Specifically, referring to FIGS. 5 and 6, first, silicon carbide single crystal substrate 80 having n type conductivity type is prepared by slicing an ingot (not shown) made of, for example, single crystal silicon carbide having a polytype of 4H. Silicon carbide single crystal substrate 80 contains an impurity such as nitrogen, for example. The impurity such as nitrogen contained in silicon carbide single crystal substrate 80 has a concentration of, for example, more than or equal to about $1\times10^{18}$ cm$^{-3}$ and less than or equal to about $1\times19$ cm$^{-3}$. Silicon carbide single crystal substrate 80 has first main surface 80a, second main surface 80b opposite to first main surface 80a, and first side end portion 80e connecting first main surface 80a and second main surface 80b.

Figure 5:
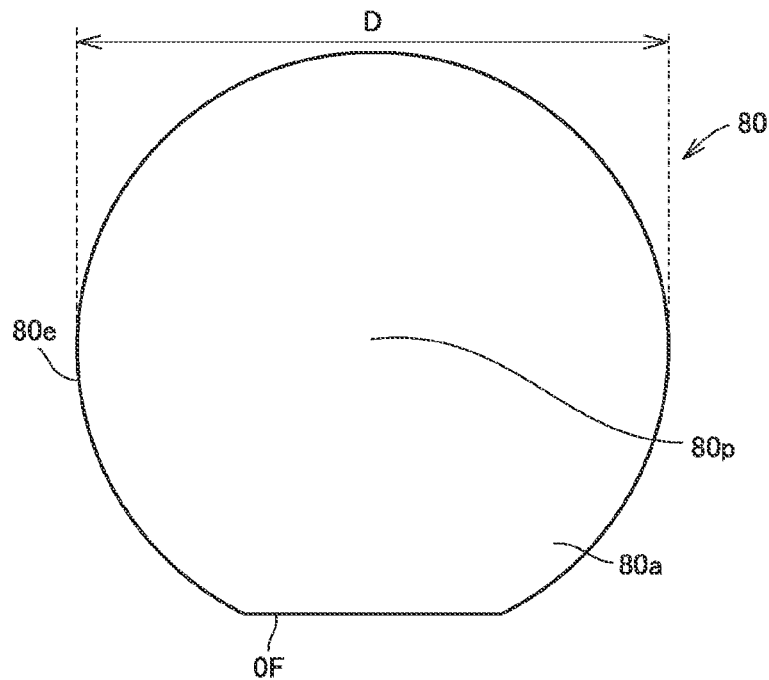
FIG. 5 is a plan view for illustrating the method for manufacturing the silicon carbide semiconductor device in accordance with the embodiment of the present invention.
Figure 6:
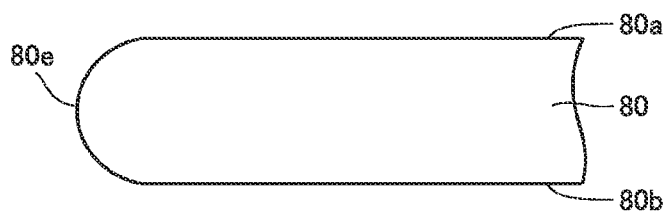
FIG. 6 is a cross sectional view for illustrating the method for manufacturing the silicon carbide semiconductor device in accordance with the embodiment of the present invention.

Referring to FIG. 5, when viewed in a plan view, silicon carbide single crystal substrate 80 has a center 80p of first main surface 80a. When first main surface 80a is a circle, center 80p is the center of the circle. When the first main surface is not a circle, center 80p is an intersection of a line which passes through the center of gravity of silicon carbide single crystal substrate 80 and is parallel to the normal to first main surface 80a, and first main surface 80a. First main surface 80a may be, for example, a {0001} plane, or a plane having an off angle of less than or equal to about 10° relative to the {0001} plane, or a plane having an off angle of less than or equal to about 0.25° relative to the {0001} plane. The maximum value of width D of first main surface 80a of silicon carbide single crystal substrate 80 is more than or equal to 100 mm. Preferably, the maximum value of width D of first main surface 80a is more than or equal to 150 mm.

Figure 7:
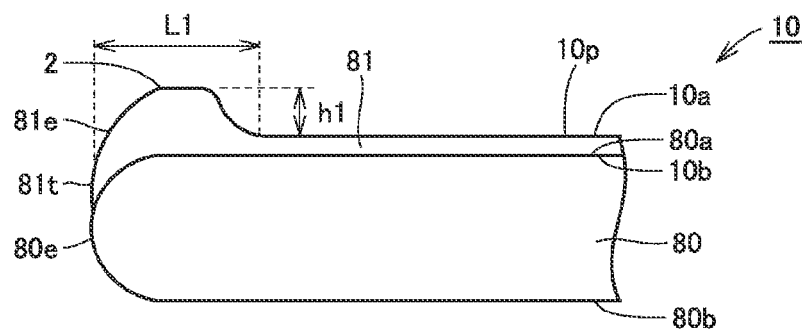
FIG. 7 is a cross sectional view for illustrating the method for manufacturing the silicon carbide semiconductor device in accordance with the embodiment of the present invention.

Next, silicon carbide epitaxial layer 81 is formed. Specifically, referring to FIG. 7, silicon carbide epitaxial layer 81 is formed in contact with first main surface 80a and first side end portion 80e of silicon carbide single crystal substrate 80, for example by a CVD (Chemical Vapor Deposition) method. Silicon carbide epitaxial layer 81 has third main surface 10b in contact with first main surface 80a, fourth main surface 10a opposite to third main surface 10b, and a second side end portion 81e connecting third main surface 10b and fourth main surface 10a.

More specifically, first, silicon carbide single crystal substrate 80 is placed within a chamber, and then the silicon carbide single crystal substrate is heated to a temperature of, for example, more than or equal to 1500° C. and less than or equal to 1700° C. Thereafter, a silicon carbide source material gas is introduced into the chamber. The silicon carbide source material gas is a gas which contains, for example, silane, propane, nitrogen, and ammonia. Thereby, silicon carbide epitaxial layer 81 is formed on first main surface 80a of silicon carbide single crystal substrate 80. On this occasion, referring to FIG. 1, when viewed in a plan view, the plurality of stepped portions 2 are formed in the vicinity of second side end portion 81e of fourth main surface 10a of epitaxial layer 81. Referring to FIG. 2, stepped portion 2 has a length of, for example, more than or equal to about 50 µm and less than or equal to about 3000 µm, or about 300 µm in a typical example, on fourth main surface 10a, in the direction from outer peripheral end portion 81t toward center 10p. Stepped portion 2 has a height of, for example, more than or equal to about 1 µm and less than or equal to about 50 µm, with respect to fourth main surface 10a, in the thickness direction of silicon carbide substrate 10 (direction perpendicular to fourth main surface 10a).

Next, the step of forming a p type body region and an n type source region in epitaxial layer 81 is performed. Specifically, in order to form p type body region 82 (see FIG. 3), ions of an impurity for imparting p type, for example such as aluminum (Al), are implanted into the entire fourth main surface 10a of n type drift region 85 (see FIG. 3). Further, in order to form n type source region 83, ions of an impurity for imparting n type, for example such as phosphorus (P), are implanted into the entire fourth main surface 10a. It should be noted that, instead of ion implantation, epitaxial growth accompanied by addition of impurities may be used.

Figure 8:
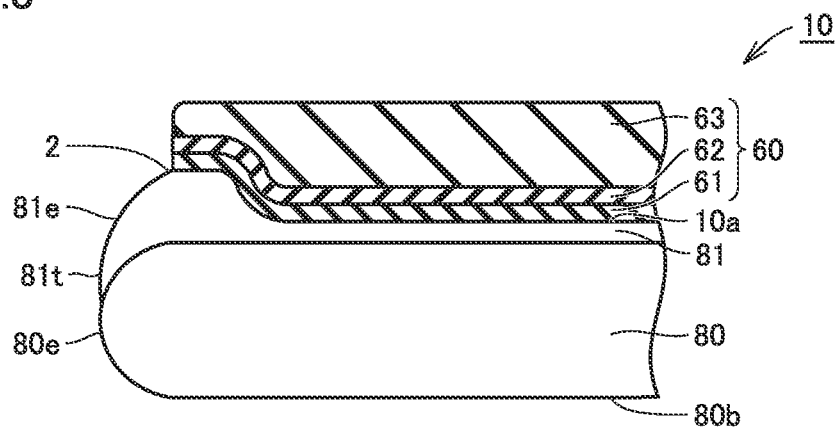
FIG. 8 is a cross sectional view for illustrating the method for manufacturing the silicon carbide semiconductor device in accordance with the embodiment of the present invention.

Next, referring to FIG. 8, the step of forming silicon dioxide layer 63 on epitaxial layer 81 (S20) is performed. The material constituting silicon dioxide layer 63 is, for example, silicon dioxide. Silicon dioxide layer 63 is provided to be laminated on epitaxial layer 81, for example, with a silicon dioxide layer 61 and a polysilicon layer 62 interposed therebetween. Specifically, silicon dioxide layer 61 is formed in contact with fourth main surface 10a and second side end portion 81e of silicon carbide epitaxial layer 81, and stepped portion 2. Next, polysilicon layer 62 is formed on silicon dioxide layer 61, and thereafter silicon dioxide layer 63 is formed on polysilicon layer 62. Silicon dioxide layers 61, 63 and polysilicon layer 62 are formed, for example, by the CVD method. Silicon dioxide layer 63 on a region located on the center 80p side of silicon carbide single crystal substrate 80 has a thickness of, for example, more than or equal to 0.8 µm and less than or equal to 20 µm. Preferably, silicon dioxide layer 63 has a thickness of, for example, more than or equal to 1.0 µm and less than or equal to 2.2 µm. On this occasion, polysilicon layer 62 may have a thickness of, for example, more than or equal to 0.01 µm and less than or equal to 0.5 µm, and silicon dioxide layer 61 may have a thickness of, for example, more than or equal to 0.01 µm and less than or equal to 0.2 µm.

Figure 9:
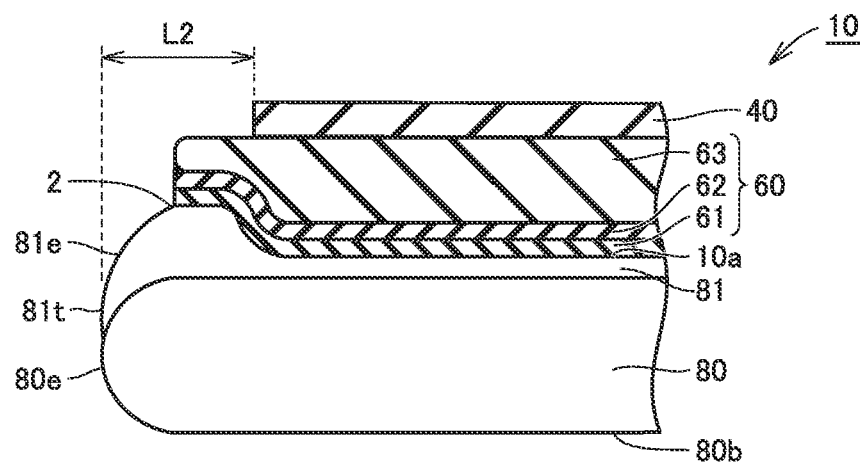
FIG. 9 is a cross sectional view for illustrating the method for manufacturing the silicon carbide semiconductor device in accordance with the embodiment of the present invention.
Figure 10:
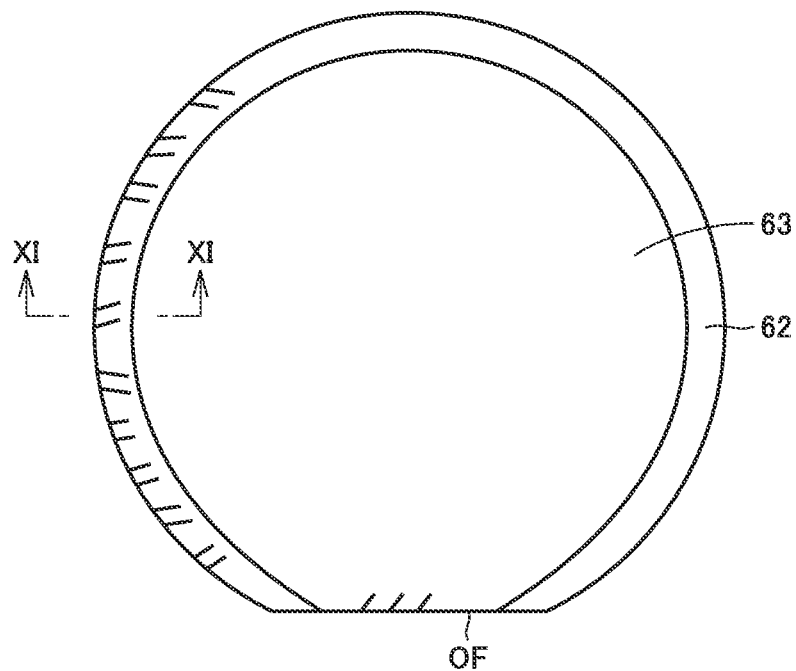
FIG. 10 is a cross sectional view for illustrating the method for manufacturing the silicon carbide semiconductor device in accordance with the embodiment of the present invention.
Figure 11:
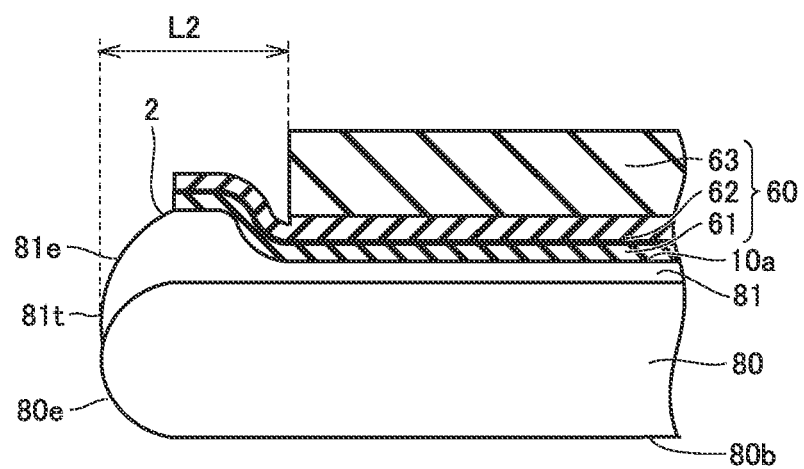
FIG. 11 is a cross sectional view for illustrating the method for manufacturing the silicon carbide semiconductor device in accordance with the embodiment of the present invention.
Figure 12:
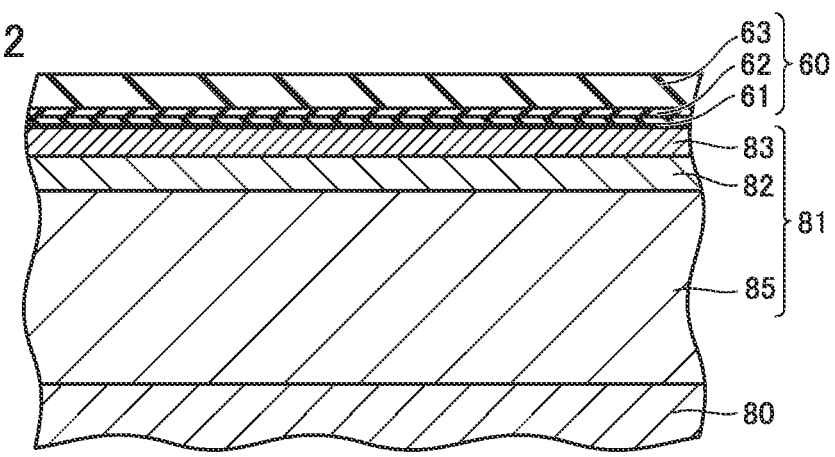
FIG. 12 is a cross sectional view for illustrating the method for manufacturing the silicon carbide semiconductor device in accordance with the embodiment of the present invention.

Next, referring to FIGS. 9 to 11, the step of removing at least a portion of silicon dioxide layer 63 in the outer peripheral portion of silicon carbide substrate 10, and patterning silicon dioxide layer 63 (S30) is performed. In this step (S30), first, the step of removing silicon dioxide layer 63 in the outer peripheral portion of silicon carbide substrate 10 (S31) is performed. Specifically, a mask layer 40 is formed by photolithography such that silicon dioxide layer 63 is exposed in a region from outer peripheral end portion 81t to a position located inside by a distance L2 toward center 10p, along the entire periphery of the outer peripheral portion of silicon carbide substrate 10 except for OF. Distance L2 is preferably longer than length L1 of stepped portion 2, and is, for example, more than or equal to 0.3 mm and less than or equal to 3 mm. Next, silicon dioxide layer 63 which is not covered with mask layer 40 and is formed in the region from outer peripheral end portion 81t to the position located inside by distance L2 toward center 10p is etched. As a method for etching, for example, dry etching can be used, and more specifically, inductively coupled plasma reactive ion etching (ICP-RIE) can be used. Thereby, silicon dioxide layer 63 formed on stepped portion 2 is removed. On this occasion, in the region from outer peripheral end portion 81t to the position located inside by distance L2 toward center 10p, a portion of polysilicon layer 62 may be removed. Further, polysilicon layer 62 and silicon dioxide layer 61 may be completely removed. It should be noted that FIG. 12 is a cross sectional view of a region where a semiconductor device is formed (element formation region) on the center 10p side of silicon carbide substrate 10 on this occasion. Silicon dioxide layer 63 formed on the element formation region is not processed in this step (S31).

Figure 13:
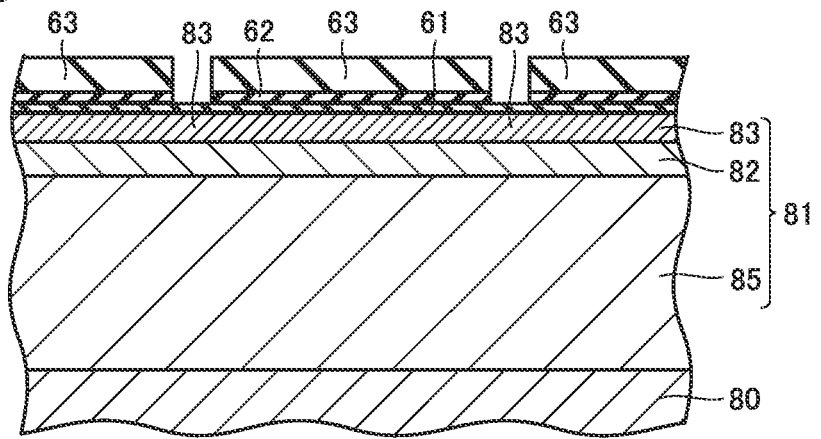
FIG. 13 is a cross sectional view for illustrating the method for manufacturing the silicon carbide semiconductor device in accordance with the embodiment of the present invention.

Next, referring to FIG. 13, the step of patterning silicon dioxide layer 63 and polysilicon layer 62 to have an opening corresponding to a position where p type contact region 84 is to be formed (S32) is performed. Specifically, first, a resist layer (not shown) having an opening corresponding to the position where p type contact region 84 is to be formed is formed on silicon dioxide layer 63 by photolithography. Next, silicon dioxide layer 63 and polysilicon layer 62 are etched to form a mask for ion implantation made of silicon dioxide layer 63. As a method for etching, for example, dry etching, and more specifically, inductively coupled plasma reactive ion etching (ICP-RIE) can be used. On this occasion, this step (S32) may be performed in two stages. Specifically, silicon dioxide layer 63 and polysilicon layer 62 may be dry-etched such that a portion of polysilicon layer 62 remains at the position where p type contact region 84 is to be formed. Thereafter, remaining polysilicon layer 62 is removed for example by dry etching, and thus silicon dioxide layer 61 is exposed at that position. At the time when this step (S32) is finished, occurrence of a crack in silicon dioxide layer 63 resulting from stepped portion 2 is suppressed. Here, heat treatment for densifying silicon dioxide layer 63 may be performed. The heat treatment for densifying silicon dioxide layer 63 is performed by holding silicon dioxide layer 63 in a nitrogen atmosphere at a temperature of 850° C. for 30 minutes. Even after the heat treatment is performed, occurrence of a crack in silicon dioxide layer 63 resulting from stepped portion 2 is suppressed.

Figure 14:
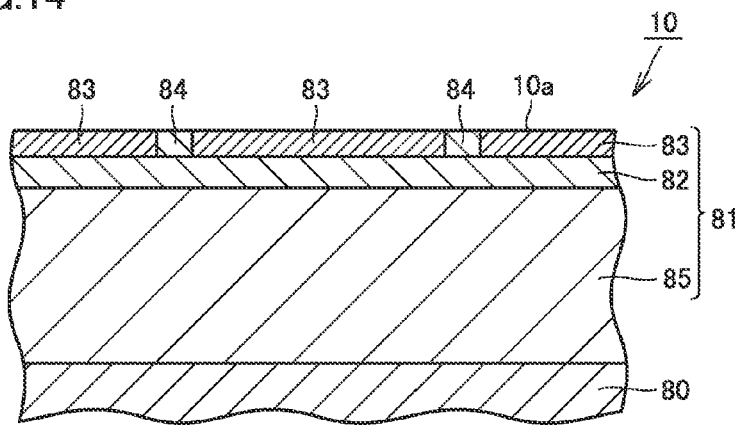
FIG. 14 is a cross sectional view for illustrating the method for manufacturing the silicon carbide semiconductor device in accordance with the embodiment of the present invention.

Next, the step of implanting ions (S40) is performed. Referring to FIG. 14, p type contact region 84 is formed by ion implantation using silicon dioxide layer 63 described above. Specifically, using silicon dioxide layer 63 patterned in the previous step (S32) as an ion implantation mask, ions of an impurity for imparting p type, for example such as aluminum (Al), are implanted into fourth main surface 10a. After the ion implantation, silicon dioxide layer 63 (see FIG. 13) is removed. Thus, p type contact region 84 of silicon carbide substrate 10 is formed by the photolithographic method and the ion implantation. Since an abnormality such as a crack does not occur in silicon dioxide layer 63 used as the ion implantation mask, an impurity-implanted region formed by the ion implantation in this step (S40) is formed only at a predetermined region, as p type contact region 84.

Next, heat treatment for activating the impurity is performed. This heat treatment is preferably performed at a temperature of more than or equal to 1500° C. and less than or equal to 1900° C., and is performed at about 1700° C., for example. The heat treatment is performed for about 30 minutes, for example. The atmosphere for the heat treatment is preferably an inert gas atmosphere, and is an Ar atmosphere, for example.

Figure 15:
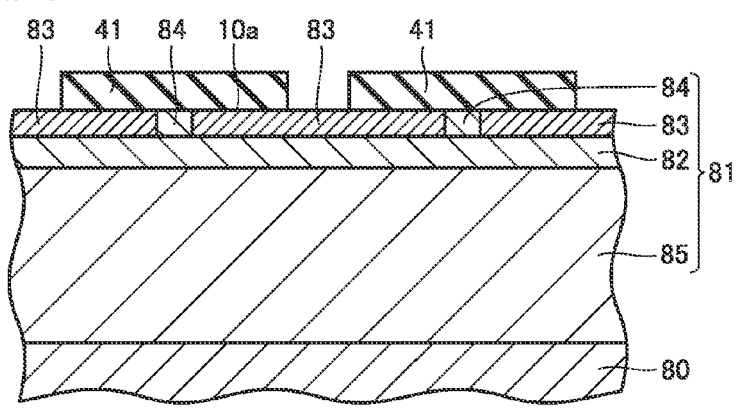
FIG. 15 is a cross sectional view for illustrating the method for manufacturing the silicon carbide semiconductor device in accordance with the embodiment of the present invention.

Referring to FIG. 15, a mask layer 41 having an opening is formed on a surface made of n type source region 83 and p type contact region 84, by the photolithography method. As mask layer 41, for example, silicon dioxide or the like can be used. The opening is formed corresponding to a position where trench TR is to be formed.

Figure 16:
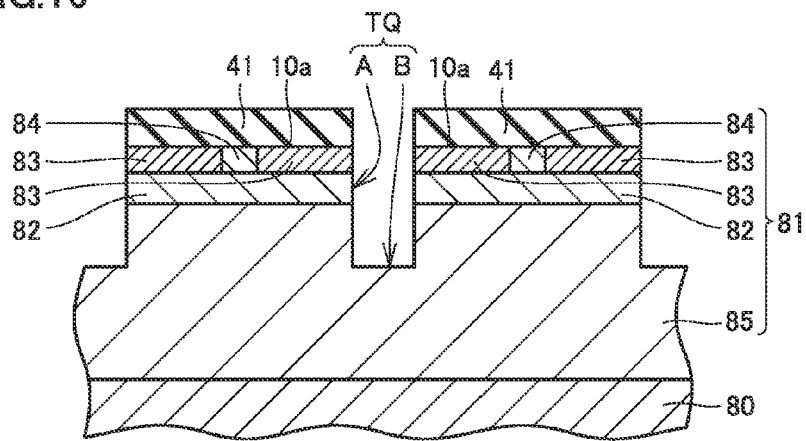
FIG. 16 is a cross sectional view for illustrating the method for manufacturing the silicon carbide semiconductor device in accordance with the embodiment of the present invention.

Next, the step of forming a recessed portion (S50) is performed. Specifically, referring to FIG. 16, a recessed portion TQ is formed in fourth main surface 10a of silicon carbide substrate 10, by performing plasma etching on silicon carbide substrate 10 having mask layer 41 formed thereon. Recessed portion TQ is formed by removing n type source region 83, p type body region 82, and a portion of n type drift region 85 of silicon carbide substrate 10 by etching, through the opening in mask layer 41. As a method for the etching, for example, dry etching, and more specifically, inductively coupled plasma reactive ion etching (ICP-RIE) can be used. By performing ICP-RIE on fourth main surface 10a of silicon carbide substrate 10 using $SF_6$ or a mixed gas of $SF_6$ and $O_2$ as a reactive gas, for example, recessed portion TQ having a wall surface A substantially along the thickness direction of silicon carbide substrate 10 (a vertical direction in the drawing) as well as a bottom portion B is formed in a region where trench TR is to be formed.

Next, a thermal etching step (S60) is performed. Specifically, thermal etching is performed on recessed portion TQ formed in silicon carbide substrate 10. In the thermal etching step, wall surface A of recessed portion TQ in silicon carbide substrate 10 is thermally etched within a furnace, while supplying a gas containing chlorine into the furnace. Silicon carbide substrate 10 is heated within the furnace, for example at more than or equal to 1000° C. and less than or equal to 1800° C. for about 20 minutes, and thereby wall surface A of recessed portion TQ in silicon carbide substrate 10 is etched. The temperature for the thermal etching of silicon carbide substrate 10 is preferably more than or equal to 800° C., more preferably more than or equal to 1300° C., and further preferably more than or equal to 1500° C. It should be noted that mask layer 41 made of silicon dioxide is not substantially etched during the thermal etching of silicon carbide, because it has an extremely high selectivity with respect to silicon carbide.

Figure 17:
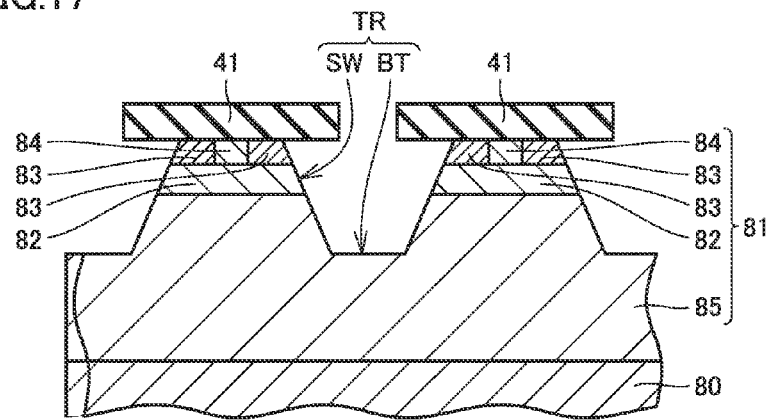
FIG. 17 is a cross sectional view for illustrating the method for manufacturing the silicon carbide semiconductor device in accordance with the embodiment of the present invention.

By performing the thermal etching step described above, wall surface A and bottom portion B of recessed portion TQ are etched by about more than or equal to 2 nm and less than or equal to 0.1 μm, for example, as shown in FIG. 17. As a result, trench TR formed of wall surface SW and bottom portion BT is formed in silicon carbide substrate 10. Wall surface SW includes a plane having a plane orientation {0-33-8} (a special plane). Next, mask layer 41 is removed by any method such as etching. Trench TR is formed of wall surface SW serving as a side surface, and bottom portion BT connected with wall surface SW. Bottom portion BT may be a surface, or may be a line. When bottom portion BT is a line, trench TR has a V shape when viewed in a cross sectional view.

Figure 18:
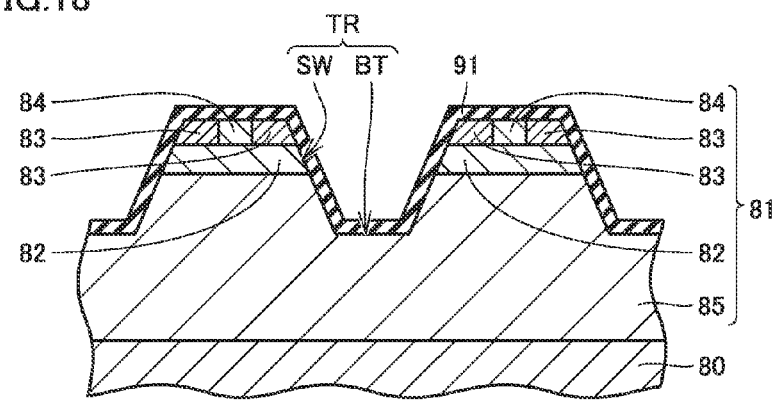
FIG. 18 is a cross sectional view for illustrating the method for manufacturing the silicon carbide semiconductor device in accordance with the embodiment of the present invention.

Next, the step of forming a gate insulating film (S70) is performed. Specifically, referring to FIG. 18, after trench TR is formed by thermally etching wall surface A of recessed portion TQ described above, gate insulating film 91 is formed in contact with wall surface SW of trench TR. Gate insulating film 91, which further covers each of wall surface SW and bottom portion BT of trench TR and is in contact with n type drift region 85, p type body region 82, n type source region 83, and p type contact region 84, is formed. Gate insulating film 91 is made of silicon dioxide, and can be formed, for example, by thermal oxidation.

After gate insulating film 91 is formed, NO annealing using nitric oxide (NO) gas as an atmospheric gas may be performed. Specifically, for example, silicon carbide substrate 10 having gate insulating film 91 formed thereon is held in a nitric oxide atmosphere, at a temperature of more than or equal to 1100° C. and less than or equal to 1300° C., for about one hour.

Figure 19:
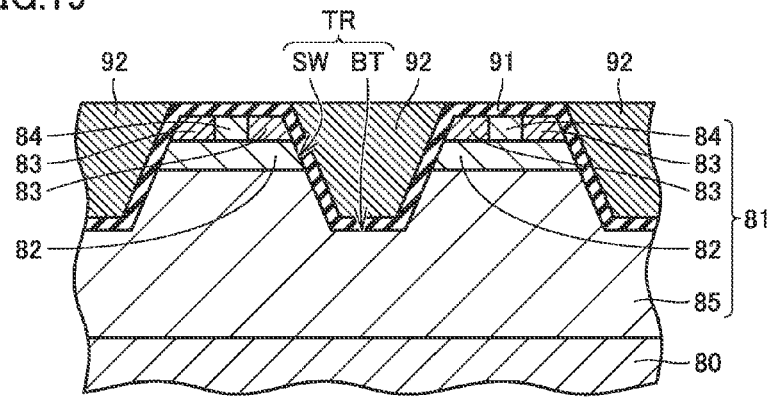
FIG. 19 is a cross sectional view for illustrating the method for manufacturing the silicon carbide semiconductor device in accordance with the embodiment of the present invention.

Next, the step of forming a gate electrode (S80) is performed. Specifically, referring to FIG. 19, gate electrode 92 is formed on gate insulating film 91. Specifically, gate electrode 92 is formed on gate insulating film 91 to fill a region inside trench TR, with gate insulating film 91 interposed therebetween. Gate electrode 92 can be formed, for example, by formation of a film of a conductor or doped polysilicon and CMP.

Figure 20:
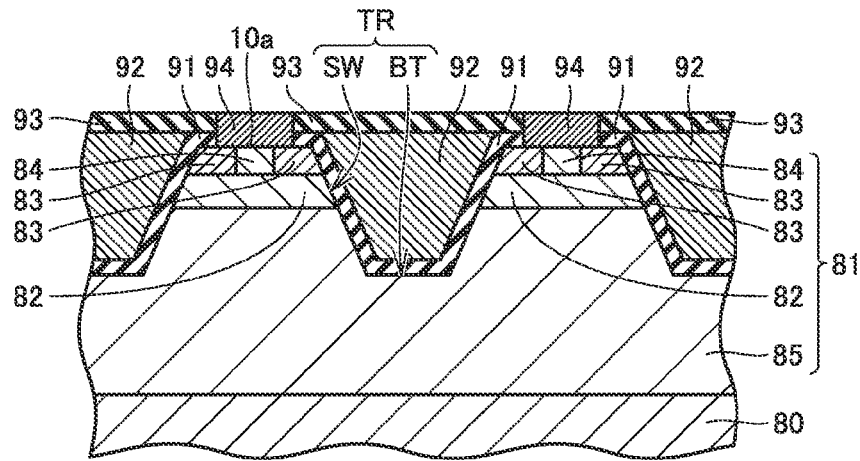
FIG. 20 is a cross sectional view for illustrating the method for manufacturing the silicon carbide semiconductor device in accordance with the embodiment of the present invention.

Next, the step of forming an interlayer insulating film (S90) is performed. Specifically, referring to FIG. 20, interlayer insulating film 93 is formed on gate insulating film 91 and gate electrode 92 to cover an exposed surface of gate electrode 92. Interlayer insulating film 93 has a thickness of, for example, more than or equal to 0.1 μm and less than or equal to 20 μm, and preferably more than or equal to 0.3 μm and less than or equal to 2.0 μm.

Next, the step of patterning interlayer insulating film 93 (S100) is performed. Specifically, interlayer insulating film 93 formed on stepped portion 2 is removed (step (S101)), by the same procedure as that for removing silicon dioxide layer 63 in the outer peripheral portion of silicon carbide substrate 10 in the step (S31) described above.

Next, interlayer insulating film 93 is patterned (step (S102)) to have an opening corresponding to a position where source electrode 94 is to be formed. Specifically, a resist layer (not shown) having an opening corresponding to the position where source electrode 94 is to be formed is formed on interlayer insulating film 93 by photolithography. Next, interlayer insulating film 93 and gate insulating film 91 are etched to form an opening corresponding to the position where source electrode 94 is to be formed, in interlayer insulating film 93 and gate insulating film 91. Through this opening, each of n type source region 83 and p type contact region 84 is exposed on fourth main surface 10*a*. As a method for etching, for example, dry etching can be used, and more specifically, inductively coupled plasma reactive ion etching (ICP-RIE) can be used.

Next, the step of forming a source electrode (S110) is performed. Source electrode 94 which is in contact with each of n type source region 83 and p type contact region 84 is formed on fourth main surface 10*a*. Specifically, a metal film containing Ti, Al, and Si, for example, is formed in contact with each of n type source region 83 and p type contact region 84, by sputtering. Next, by annealing silicon carbide substrate 10 having the metal film formed thereon at about 1000° C., the metal film is alloyed, and thus source electrode 94 which is in ohmic contact with silicon carbide substrate 10 is formed. Similarly, drain electrode 98 may be formed on second main surface 80*b* of silicon carbide single crystal substrate 80.

Referring to FIG. 3 again, source wire 95 is formed to be in contact with source electrode 94 and interlayer insulating film 93. As source wire 95, for example, a Ti/Al layer is used. Thus, silicon carbide semiconductor device 100 is completed.

Next, the function and effect of the method for manufacturing the silicon carbide semiconductor device in accordance with the present embodiment will be described.

According to the method for manufacturing the silicon carbide substrate in accordance with the embodiment, silicon dioxide layer 63 formed on silicon carbide epitaxial layer 81 in the outer peripheral portion of the silicon carbide substrate is removed before being patterned as an ion implantation mask. That is, even when stepped portion 2 is formed on epitaxial layer 81, silicon dioxide layer 63 formed on stepped portion 2 is removed before being patterned as an ion implantation mask. Accordingly, this can suppress a crack starting from the stepped portion from occurring in silicon dioxide layer 63 due to a stress generated within silicon dioxide layer 63 when silicon dioxide layer 63 is patterned.

Further, stepped portion 2 has a length of, for example, more than or equal to about 50 μm and less than or equal to about 3000 μm, or about 300 μm in a typical example, on fourth main surface 10*a*, in the direction from outer peripheral end portion 81*t* toward center 10*p*. Accordingly, by removing silicon dioxide layer 63 formed at a position of more than or equal to 0.3 mm and less than or equal to 3.0 mm in the direction from outer peripheral end portion 81*t* toward center 10*p* in the step (S31), silicon dioxide layer 63 formed on stepped portion 2 can be removed. Therefore, silicon dioxide layer 63 formed on epitaxial layer 81 of the silicon carbide substrate in the step (S30) is completely independent of stepped portion 2, and thus a crack in silicon dioxide layer 63 starting from stepped portion 2 can be suppressed.

Further, interlayer insulating film 93 formed on silicon carbide epitaxial layer 81 in the outer peripheral portion of the silicon carbide substrate is also removed before being patterned, as with silicon dioxide layer 63. Accordingly, this can suppress a crack starting from the stepped portion from occurring in interlayer insulating film 93 due to a stress generated within interlayer insulating film 93 when interlayer insulating film 93 is patterned.

Although silicon dioxide layer 63 and interlayer insulating film 93 formed on the outer peripheral portion of silicon carbide single crystal substrate 80 are completely removed in the present embodiment, the present invention is not limited thereto. The film thickness of silicon dioxide layer 63 may be reduced to a film thickness of, for example, more than or equal to about 1 nm and less than or equal to about 800 nm, before silicon dioxide layer 63 is patterned. This can also reduce a risk that a crack occurs in silicon dioxide layer 63 after silicon dioxide layer 63 is patterned, in a case where stepped portion 2 is formed in epitaxial layer 81 in the outer peripheral portion of silicon carbide substrate 10. Similarly, the film thickness of interlayer insulating film 93 may be reduced to a film thickness of, for example, more than or equal to about 1 nm and less than or equal to about 800 nm, before interlayer insulating film 93 is patterned. This can also reduce a risk that a crack occurs in interlayer insulating film 93, in the case where stepped portion 2 is formed in epitaxial layer 81 in the outer peripheral portion of silicon carbide substrate 10.

Figure 21:
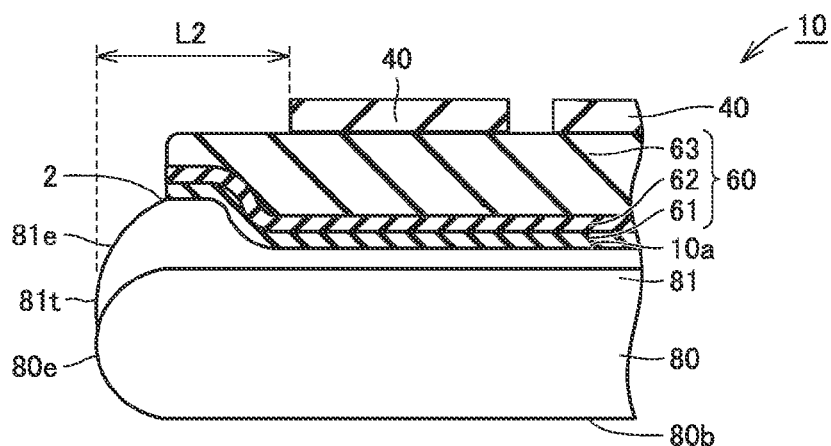
FIG. 21 is a cross sectional view for illustrating a variation of the method for manufacturing the silicon carbide semiconductor device in accordance with the embodiment of the present invention.
Figure 22:
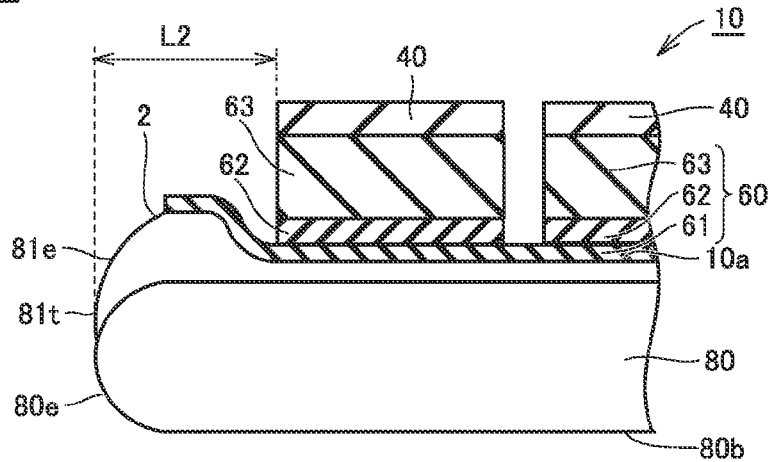
FIG. 22 is a cross sectional view for illustrating the variation of the method for manufacturing the silicon carbide semiconductor device in accordance with the embodiment of the present invention.

Further, although silicon dioxide layer 63 and interlayer insulating film 93 formed on silicon carbide epitaxial layer 81 in the outer peripheral portion of silicon carbide substrate 10 are removed before being patterned as an ion implantation mask or an interlayer insulating film in the present embodiment, they may be removed simultaneously when being patterned. For example, referring to FIG. 21, first, a mask is formed by photolithography so as to expose silicon dioxide layer 63 in a region from outer peripheral end portion 81*t* to a position located inside by distance L2 toward center 10*p*, along the entire periphery of the outer peripheral portion of silicon carbide substrate 10 except for OF, and to have an opening corresponding to a position where p type contact region 84 is to be formed. Next, referring to FIG. 22, silicon dioxide layer 63 exposed from the mask is removed for example by dry etching. This can also reduce a stress applied to silicon dioxide layer 63 formed on the center 10*p* side of silicon carbide substrate 10, when compared with a conventional method for manufacturing a silicon carbide semiconductor device in which silicon dioxide layer 63 is patterned with being thickly formed in the outer peripheral portion of silicon carbide substrate 10. Accordingly, this can reduce a risk that a crack occurs in silicon dioxide layer 63.

Furthermore, although silicon carbide semiconductor device 100 is constituted as a vertical MOSFET in the present embodiment, the present invention is not limited thereto. The silicon carbide semiconductor device may be, for example, a lateral MOSFET. In this case, for example, the step (S20) to the step (S40) in the present embodiment may be repeatedly performed when forming each impurity-implanted region. Moreover, the silicon carbide semiconductor device may be a trench-type MOSFET, or a planartype MOSFET. The silicon carbide semiconductor device may be an IGBT (Insulated Gate Bipolar Transistor), an SBD (Schottky Barrier Diode), or the like.

Although the embodiment of the present invention has been described above, the embodiment described above can be modified variously. Further, the scope of the present invention is not limited to the embodiment described above. The scope of the present invention is defined by the scope of the claims, and is intended to include any modifications within the scope and meaning equivalent to the scope of the claims.

INDUSTRIAL APPLICABILITY

The present invention is particularly advantageously applied to a method for manufacturing a silicon carbide semiconductor device using a large-diameter silicon carbide substrate having a silicon carbide epitaxial layer.

REFERENCE SIGNS LIST

2: stepped portion; 10: silicon carbide substrate; 10a: fourth main surface; 10b: third main surface; 10p, 80p: center; 40, 41: mask layer; 61, 63: silicon dioxide layer; 62: polysilicon layer; 80: single crystal substrate; 80a: first main surface; 80b: second main surface; 80e: first side end portion; 81: epitaxial layer; 81e: second side end portion; 81t: outer peripheral end portion; 82: p type body region; 83: n type source region; 84: p type contact region; 85: n type drift region; 91: gate insulating film; 92: gate electrode; 93: interlayer insulating film; 94: source electrode; 95: source wire; 98: drain electrode; 100: silicon carbide semiconductor device.

The invention claimed is:

1. A method for manufacturing a silicon carbide semiconductor device, comprising the steps of:

forming an epitaxial layer by epitaxial growth on a main surface of a silicon carbide single crystal substrate including a central portion and an outer peripheral portion to prepare a silicon carbide substrate having said epitaxial layer formed thereon, said epitaxial layer including a stepped portion in said outer peripheral portion of said silicon carbide substrate, said stepped portion being formed such that a height from an upper surface of said central portion of said epitaxial layer to a highest point of said stepped portion in said outer peripheral portion, which is farther away from an upper surface of said silicon carbide single crystal substrate than said upper surface of said central portion is, is more than or equal to 1 μm and less than or equal to 50 μm;

forming an upper-layer film on said epitaxial layer to cover said stepped portion; and removing at least a portion of said upper-layer film in said outer peripheral portion of said silicon carbide substrate, and patterning said upper-layer film, wherein, in said step of patterning, the at least a portion of said upper-layer film on a region where said stepped portion is formed in said epitaxial layer in said outer peripheral portion is removed.

2. The method for manufacturing the silicon carbide semiconductor device according to claim 1, wherein, in said step of patterning, said upper-layer film is patterned after removing the at least a portion of said upper-layer film in the outer peripheral portion of said silicon carbide substrate.

3. The method for manufacturing the silicon carbide semiconductor device according to claim 1, wherein, in said step of patterning, patterning of said upper-layer film and removal of the at least a portion of said upper-layer film in the outer peripheral portion of said silicon carbide substrate are performed as one step.

4. The method for manufacturing the silicon carbide semiconductor device according to claim 1, wherein, in said step of patterning, said upper-layer film is removed along an entire periphery of said outer peripheral portion.

5. The method for manufacturing the silicon carbide semiconductor device according to claim 1, wherein, in said step of patterning, a region where the at least a portion of said upper-layer film is removed is a belt-like region having a width of more than or equal to 0.3 mm and less than or equal to 3 mm in a direction from an outer peripheral end portion toward a center of said silicon carbide substrate.

6. The method for manufacturing the silicon carbide semiconductor device according to claim 1, wherein said upper-layer film is made of silicon dioxide.

7. The method for manufacturing the silicon carbide semiconductor device according to claim 1, wherein said silicon carbide substrate has an outer diameter of more than or equal to 100 mm.

* * * * *